United States Patent
Coteus et al.

(10) Patent No.: US 10,215,504 B2
(45) Date of Patent: Feb. 26, 2019

(54) FLEXIBLE COLD PLATE WITH ENHANCED FLEXIBILITY

(71) Applicant: International Business Machines Corporation, Armonk, NY (US)

(72) Inventors: Paul W. Coteus, Yorktown, NY (US); Shawn A. Hall, Pleasantville, NY (US); Mark D. Schultz, Ossining, NY (US); Todd E. Takken, Brewster, NY (US); Shurong Tian, Mount Kisco, NY (US)

(73) Assignee: International Business Machines Corporation, Armonk, NY (US)

(*) Notice: Subject to any disclaimer, the term of this patent is extended or adjusted under 35 U.S.C. 154(b) by 75 days.

(21) Appl. No.: 14/818,117

(22) Filed: Aug. 4, 2015

(65) Prior Publication Data
US 2016/0290728 A1 Oct. 6, 2016

Related U.S. Application Data

(60) Provisional application No. 62/143,612, filed on Apr. 6, 2015.

(51) Int. Cl.
*F28F 7/00* (2006.01)
*F28F 3/12* (2006.01)
(Continued)

(52) U.S. Cl.
CPC ............... *F28F 3/044* (2013.01); *F28F 3/12* (2013.01); *H01L 23/473* (2013.01);
(Continued)

(58) Field of Classification Search
CPC ............. H01L 23/473; F28D 15/0241; F28D 2021/0028; F28D 2021/0029;
(Continued)

(56) References Cited

U.S. PATENT DOCUMENTS 5,150,274 A * 9/1992 Okada ................. H01L 23/3733
165/185
5,453,911 A * 9/1995 Wolgemuth ....... H05K 7/20927
165/80.4
(Continued)

FOREIGN PATENT DOCUMENTS

JP WO 2014112600 A1 * 7/2014 ................ F28F 3/12

OTHER PUBLICATIONS

Office Action dated Nov. 13, 2017 received in U.S. Appl. No. 14/818,064, 26 pages.
(Continued)

*Primary Examiner* — Jason Thompson
(74) *Attorney, Agent, or Firm* — Scully, Scott, Murphy & Presser, P.C.; Daniel Morris, Esq.

(57) ABSTRACT

An apparatus for cooling an electronic component has a planar top member of a thermal energy conductive material and a parallel planar bottom member of the material, the planar bottom member including a surface having regions configured for heat exchange contact with the electronic component. The joined planar top and bottom members have a sidewall structure of reduced height (and generally the height of the cold plate) between active areas in order to improve flexibility. The stiffness of the sidewalls is reduced by very advantageously reduce the height of the sidewalls. In one embodiment, the sidewalls are shorter in height corresponding to regions only between active areas. Alternatively, the sidewalls are of reduced height everywhere by insetting the active areas within the top and/or bottom sheets.

16 Claims, 7 Drawing Sheets

(51) Int. Cl.
  *F28F 3/14* (2006.01)
  *F28F 3/04* (2006.01)
  *H01L 23/473* (2006.01)
  *H05K 7/20* (2006.01)

(52) U.S. Cl.
  CPC ...... *H05K 7/20254* (2013.01); *F28F 2225/04* (2013.01); *F28F 2255/02* (2013.01)

(58) Field of Classification Search
  CPC ............... F28D 2021/0064; F28F 3/12; H05K 7/20254; H05K 7/20509
  USPC ........................ 165/168, 80.4, 170
  See application file for complete search history.

(56) References Cited

U.S. PATENT DOCUMENTS

| | | | |
|---|---|---|---|
| 6,082,443 A | 7/2000 | Yamamoto et al. | |
| 6,269,866 B1 | 8/2001 | Yamamoto et al. | |
| 6,397,935 B1 | 6/2002 | Yamamoto et al. | |
| 6,535,386 B2 | 3/2003 | Sathe et al. | |
| 7,017,651 B1* | 3/2006 | Wilson | H01L 23/473 165/109.1 |
| 7,121,002 B1 | 10/2006 | Roth | |
| 7,264,045 B2 | 9/2007 | Mehendale et al. | |
| 8,736,048 B2 | 5/2014 | Schultz | |
| 2003/0155105 A1 | 8/2003 | Garner | |
| 2003/0159806 A1 | 8/2003 | Sehmbey et al. | |
| 2004/0150271 A1 | 8/2004 | Koga et al. | |
| 2005/0115700 A1* | 6/2005 | Martin | B23K 1/0012 165/170 |
| 2006/0038284 A1* | 2/2006 | Brandenburg | H01L 23/473 257/714 |
| 2007/0214829 A1 | 9/2007 | Otake et al. | |
| 2007/0227697 A1* | 10/2007 | Takahashi | H01L 23/473 165/80.4 |
| 2007/0240860 A1 | 10/2007 | Meyer, IV et al. | |
| 2008/0047141 A1 | 2/2008 | Yang | |
| 2010/0090336 A1* | 4/2010 | Yoshida | H01L 23/473 257/717 |
| 2011/0108247 A1* | 5/2011 | Kawaura | H01L 23/473 165/104.33 |
| 2011/0315367 A1* | 12/2011 | Romero | B23K 20/122 165/185 |
| 2012/0014066 A1* | 1/2012 | Morino | H01L 23/473 361/707 |
| 2012/0082880 A1 | 4/2012 | Koetting et al. | |
| 2013/0140011 A1* | 6/2013 | Watanabe | H01L 23/36 165/168 |
| 2015/0369545 A1* | 12/2015 | Naritomi | B23P 15/26 165/76 |

OTHER PUBLICATIONS

Schultz, "Laterally Compliant Heat Sink for Multi-Chip Modules", IBM Corporation, Thomas J. Watson Research Center, Jan. 10, 2010.

Schultz, "QCM direct Attach", IBM Corporation, Thomas J. Watson Research Center, Sep. 2010.

List of IBM Patents or Patent Applications Treated as Related.

* cited by examiner

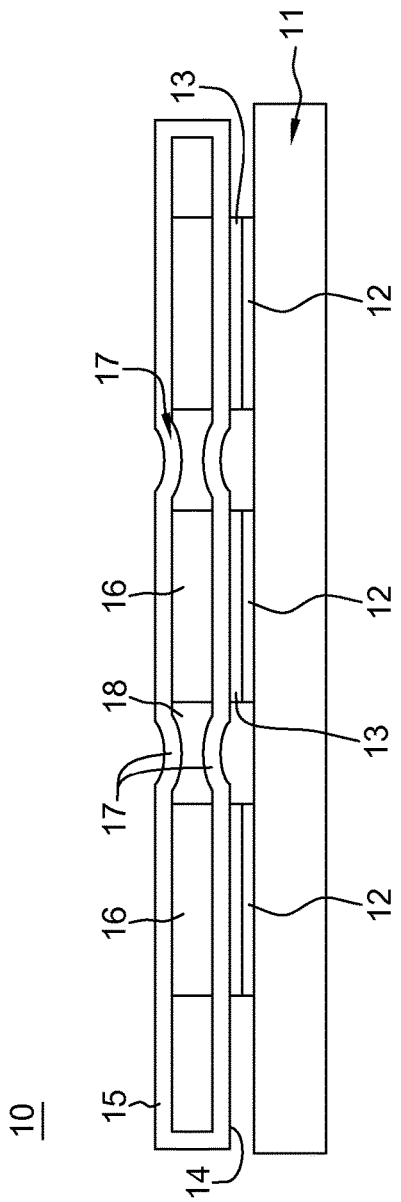
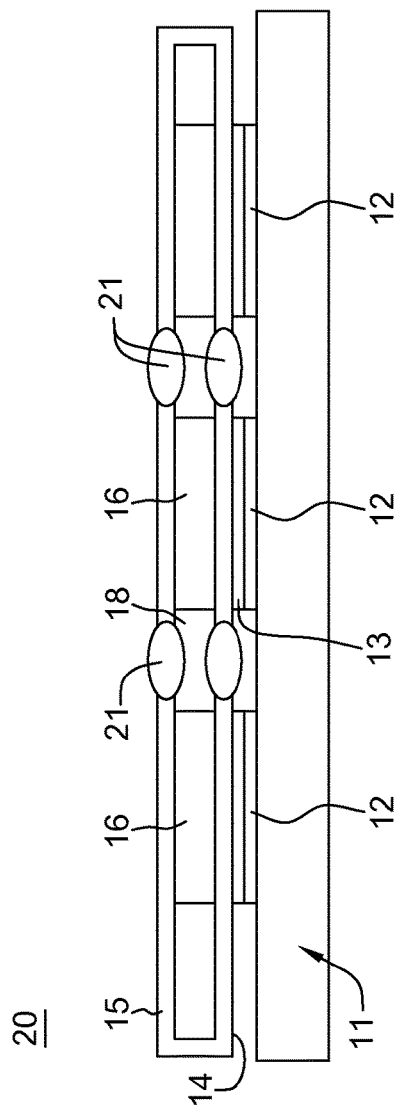
FIG. 1A
PRIOR ART
FIG. 1B
PRIOR ART

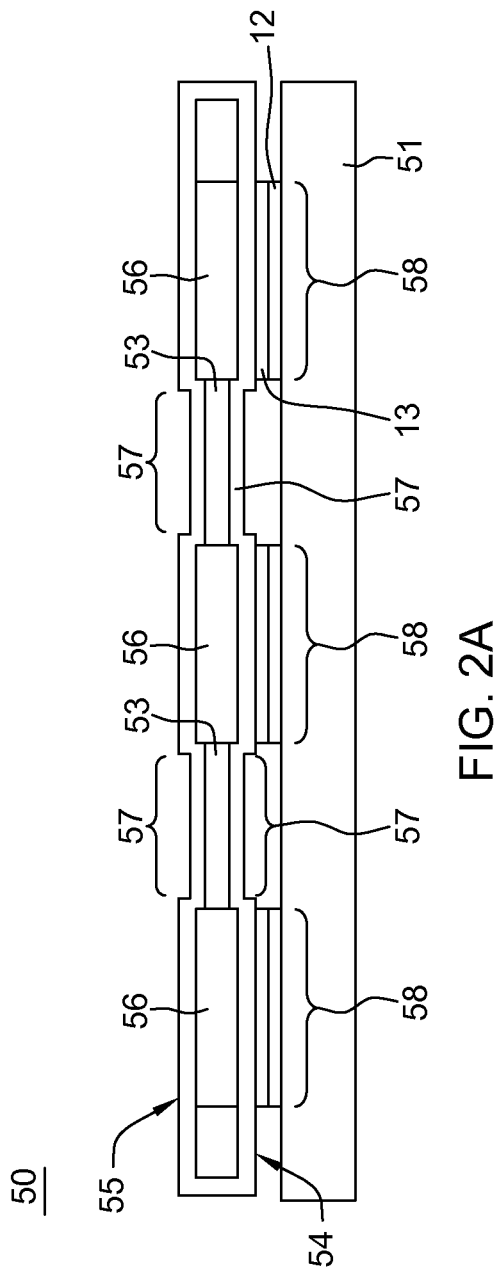
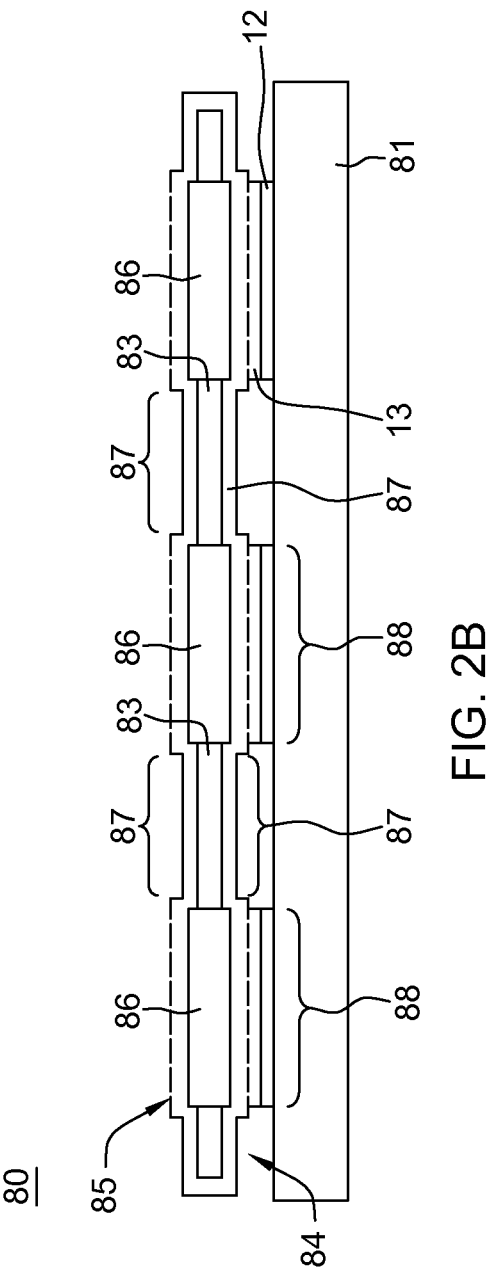
FIG. 2A
FIG. 2B

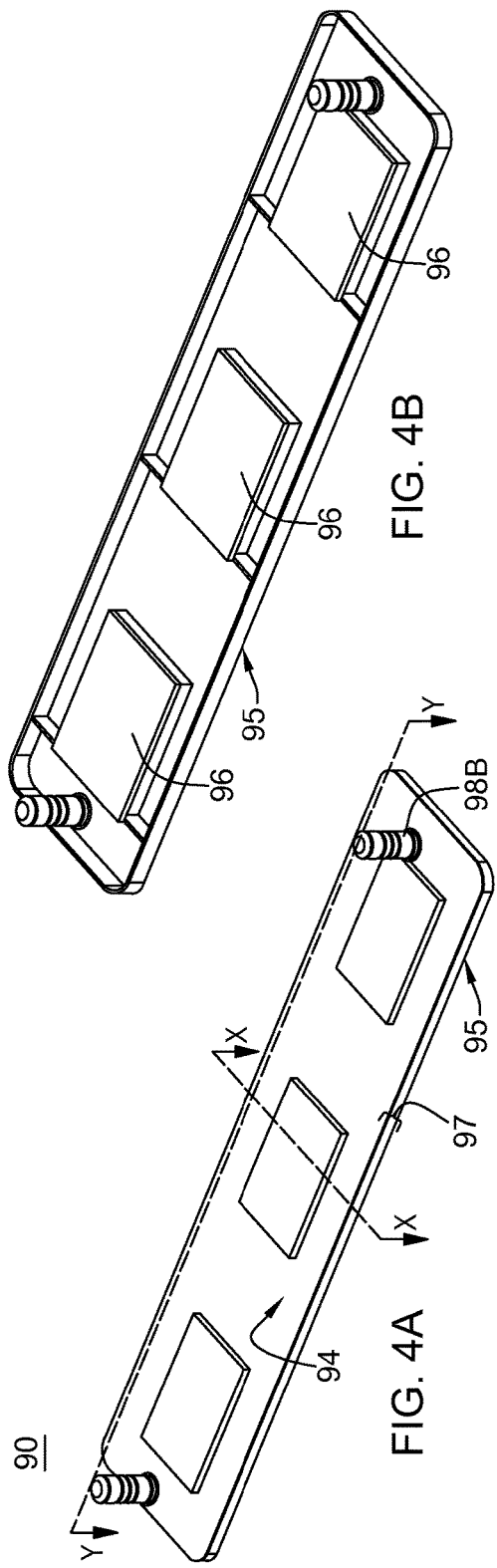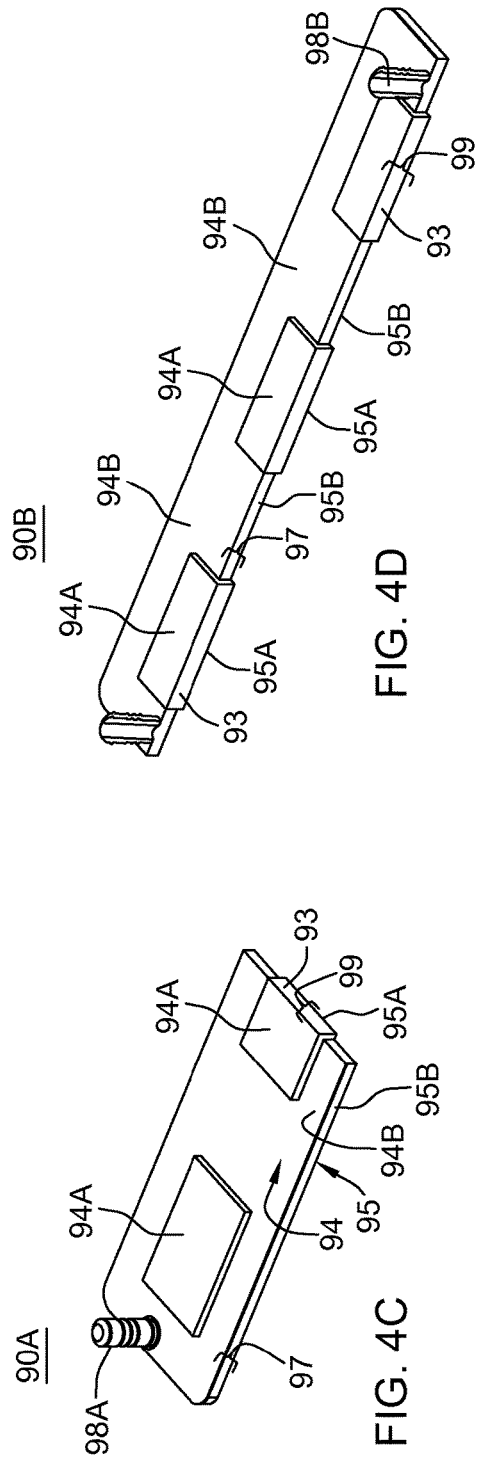

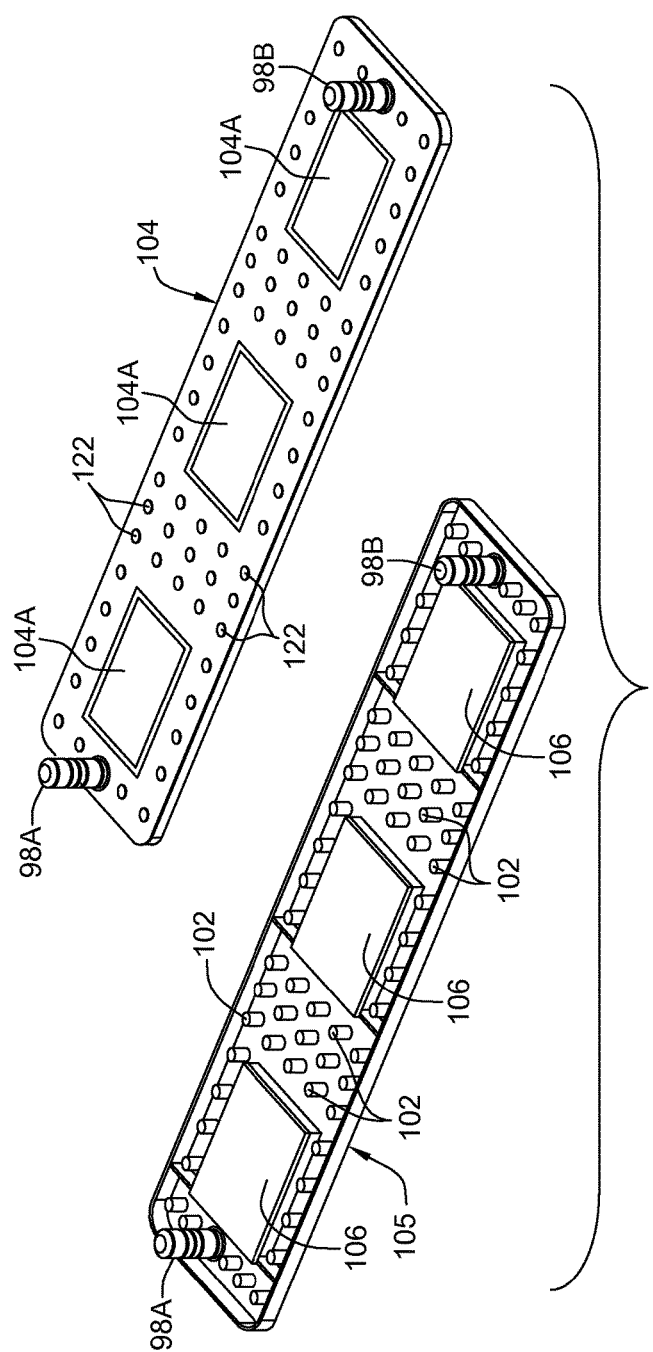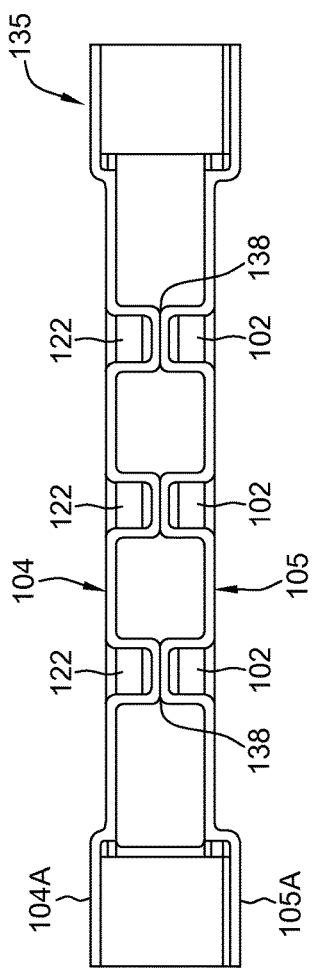

FLEXIBLE COLD PLATE WITH ENHANCED FLEXIBILITY

STATEMENT REGARDING FEDERALLY SPONSORED RESEARCH/DEVELOPMENT

This invention was made with Government support under Contract Numbers: B601996 and B604142 awarded by Department of Energy. The Government has certain rights in this invention.

CROSS-REFERENCE TO RELATED APPLICATIONS

The present disclosure is a conversion application of U.S. Patent Application Ser. No. 62/143,612, the contents of which are wholly incorporated herein.

FIELD

The present disclosure generally relates to heat sinks, such as used for cooling components in electronic devices, e.g., computers, and more particularly to a flexible thin-walled cooling apparatus (heat sink or cold plate).

BACKGROUND

With the increase in heat dissipation from microelectronic devices and the reduction in overall form factors, thermal management becomes a more and more important element of electronic product design. Both the performance reliability and life expectancy of electronic equipment are inversely related to the component temperature of the equipment.

Heat sinks function by efficiently dissipating thermal energy (i.e., "heat") generated from an object (e.g., electronic module or microelectronic component) into a cooler ambient, e.g., the air; and at least transfer thermal energy from an object at a high temperature to a second object at a lower temperature with a much greater heat capacity.

In a common design of a heat sink, a metal device having a flat surface (e.g., a copper or aluminum base) is provided with an array of combs or fin-like protrusions to increase the heat sink's surface area contacting the air and thus increase the heat dissipation rate. A high thermal conductivity of the metal base combined with its large surface area provided by the protrusions result in the rapid transfer of thermal energy to the surrounding, cooler air.

Liquid cold plates, on the other hand, provide an alternative advantage over some air cooled solutions in high watt density applications and may include tubed cold plates, flat tube cold plates, performance-fin cold plates and liquid-cooled chassis designs.

Flexible cold plates have been proposed as a means of reducing the cost of cooling multiple neighboring devices U.S. Pat. No. 8,736,048 addresses flexibility improvements of heat sink and cold plate designs with "lateral compliance features". For example, FIG. 1A shows conceptually a prior art heat sink design that incorporates lateral compliance into a vertically flexible/compliant heat sink which allows strain to be absorbed by the heat sink rather than by the thermal interface material (TIM) that provides an interface for heat exchange between the chip and the heat sink. As shown in FIG. 1A, the vertically flexible/compliant heat sink 10 with lateral compliance is shown secured in heat exchange relation with electronic components, e.g., chips 12, mounted on a carrier or substrate 11 of an electronic chip module (e.g., a multi-chip module or MCM). In this design, each chip 12 terminates in chip contact patches 13. The heat sink 10 includes a thin thermally conductive flexible heat sink sheet 14 having lateral compliance that extends in a plane over the chips 12 and is secured to chips 12 through chip contact patches 13 utilizing a thermal interface material (TIM) (not shown). Heat transfer elements (HTE) 16 such as fins, pins or other heat transfer structures are mounted on flexible heat sink sheet 14 having lateral compliance and support a thin thermally conductive flexible heat sink sheet 15 having lateral compliance that also extends in a plane above the MCM device. Flexible heat sink sheet 14 having lateral compliance HTE 16, flexible heat sink sheet 15 having lateral compliance, define channels 18 through which a cooling fluid or heat exchange fluid flows to carry away any heat developed in the MCM.

The thin top and bottom heat sink sheets 15 and 14 provide flexibility to accommodate tilted chips and level differences between chips. Adding lateral compliance features, i.e., bends 17, to at least the bottom (chipside) sheet 14, and optionally sheet 15, allows for lateral expansion and contraction of the heat sink relative to the substrate without moving or significantly stressing the individual chip contact patches 13. That is, the heat sink 10 of FIG. 1A provides a lateral compliance feature that minimizes or eliminates shear stress and shear strain developed in the horizontal direction at the interface between the heat sink and the ship contact patches by allowing for horizontal expansion and contraction of the heat sink relative to the underlying electronic chip module without moving the individual chip contact patches in a horizontal direction.

In a further prior art heat sink 20 shown in FIG. 1B, the thin top and bottom heat sink sheets 15 and 14 provide flexibility to accommodate tilted chips and level differences between chips by adding a lateral compliance feature in the form of an elastomer 21 that secures the facing, substantially parallel edges of adjoining separate heat sink sheets to allow for lateral expansion and contraction of the heat sink relative to the substrate without moving or significantly stressing the individual chip contact patches.

These lateral compliance features are more useful when the active area can be distanced from the sidewall and when the height difference between elements to be cooled is relatively small. When the height difference increases and the active area is near the allowed width of the flexible heat sink, such features are less effective. Such features also complicate flow control/blocking outside the active area.

In certain systems, the load that can be applied to force active areas (e.g., areas where heat is primarily transferred) of the flexible cold plate in to contact with the element being cooled is constrained. In addition, the load applied to the heat sink can produce non-uniform loading of the element being cooled if the heat sink is too stiff. For adequate thermal performance, a cold plate has a minimum height in the active area, and the system constraints can limit the overall width of the cold plate. These constraints can result in an overly stiff flexible cold plate.

BRIEF SUMMARY

There is provided a practical design for a heat sink or cooling plate cooling device that implements a reduced the heat sink height between active areas to reduce the stiffness of the heat sink sidewall.

Generally, in one aspect, the height of the sidewalls (and generally the height of the cold plate) is reduced between the active areas in order to improve flexibility. The stiffness of the sidewalls is an exponential function of their height, making it very advantageous to reduce the height.

In one aspect, the sidewalls are shorter than the active area height only between active areas. Alternately, there is a reduced sidewall height everywhere by insetting the active areas within the top and/or bottom sheets.

According to an aspect of the present disclosure, there is provided a cooling apparatus for an electronic device. The cooling apparatus comprises: a planar top member of a thermal energy conductive material; a planar bottom member of the thermal energy conductive material, both the planar top member and planar bottom member including a surface having aligned one or more raised regions, a raised region of the planar bottom member configured for heat exchange contact with the electronic device; a sidewall structure of extending between the top and bottom members and joining the top member to the bottom member, the planar top member, parallel bottom member and sidewall defining a chamber, wherein a height distance of the sidewall structure between regions corresponding to the aligned one or more the raised regions of the top and bottom member surfaces is reduced relative to the height distance between the top member and bottom member at the raised regions.

Further to this aspect, the sidewall structure extends along a periphery of the apparatus between the top and bottom members, and a height of the sidewall structure extending between the top and bottom members and joining the top member to the bottom member at each respective end of the apparatus is substantially the same height as the height distance between the top member and bottom member at the raised regions.

According to another aspect of the present disclosure, a cooling apparatus for an electronic device comprises: a planar top member of a thermal energy conductive material; a planar bottom member of the thermal energy conductive material, both the planar top member and planar bottom member including a surface having aligned one or more raised regions, a raised region of the planar bottom member configured for heat exchange contact with the electronic device; a sidewall structure of extending between the top and bottom members and joining the top member to the bottom member, the planar top member, parallel bottom member and sidewall defining a chamber, wherein a height distance of the sidewall structure between regions corresponding to the aligned one or more the raised regions of the top and bottom member surfaces is reduced relative to the height distance between the top member and bottom member at the raised regions, and a height of the sidewall structure extending between the top and bottom members and joining the top member to the bottom member at each respective end of the apparatus is reduced relative to the height distance between the top member and bottom member at the raised regions.

The heat sink or cooling plate cooling device designs may include other flexible laterally compliant features such as bends and/or elastomer.

BRIEF DESCRIPTION OF THE SEVERAL VIEWS OF THE DRAWINGS

FIG. 1A is a cross-sectional view of a heat sink cooling device having a lateral compliance feature according to a prior art design;

FIG. 1B is a cross-sectional view of a heat sink cooling device having a lateral compliance feature according to a further prior art design;

FIG. 2A is a cross-sectional view of a heat sink cooling device 50 providing enhanced flexibility according to an embodiment of the present disclosure;

FIG. 2B is a cross-sectional view of a heat sink cooling device 80 providing enhanced flexibility according to an alternative embodiment of the present disclosure;

FIG. 4A shows an exposed, perspective view of a heat sink cooling device 90 corresponding to an alternative embodiment of the cooling apparatus 80 of FIG. 2B;

FIG. 4B shows an exposed, perspective view of the bottom parallel sheet portion 95 of the heat sink cooling device 90 of FIG. 4A;

FIG. 4C shows a perspective view of a portion 90A of the heat sink cooling device 90 as shown in the FIG. 4A taken along a line x-x transverse to the length of the apparatus 90;

FIG. 4D shows a perspective view of a portion 90B of the heat sink cooling device 90 as shown in the FIG. 4A taken along a line y-y along a length axis of the apparatus 90;

FIG. 7 shows an exploded, perspective view of a planar first plate member 104 and bottom plate member 105 of FIG. 5 according to a further embodiment wherein both the top and bottom members include plurality of post members or stamped indent formations formed in each surface and aligned such that when subject to brazing or soldering the contact surfaces of the top and bottom thin-walled members are secured together in forming the apparatus; and FIG. 7A depicts a zoomed-in portion 135 of a cross-sectional view of the formed cooling apparatus 100 of FIG. 7 showing contact surfaces of respective stamped indent formations being brazed or soldered together in fixing the top and bottom members.

DETAILED DESCRIPTION

Figure 3:
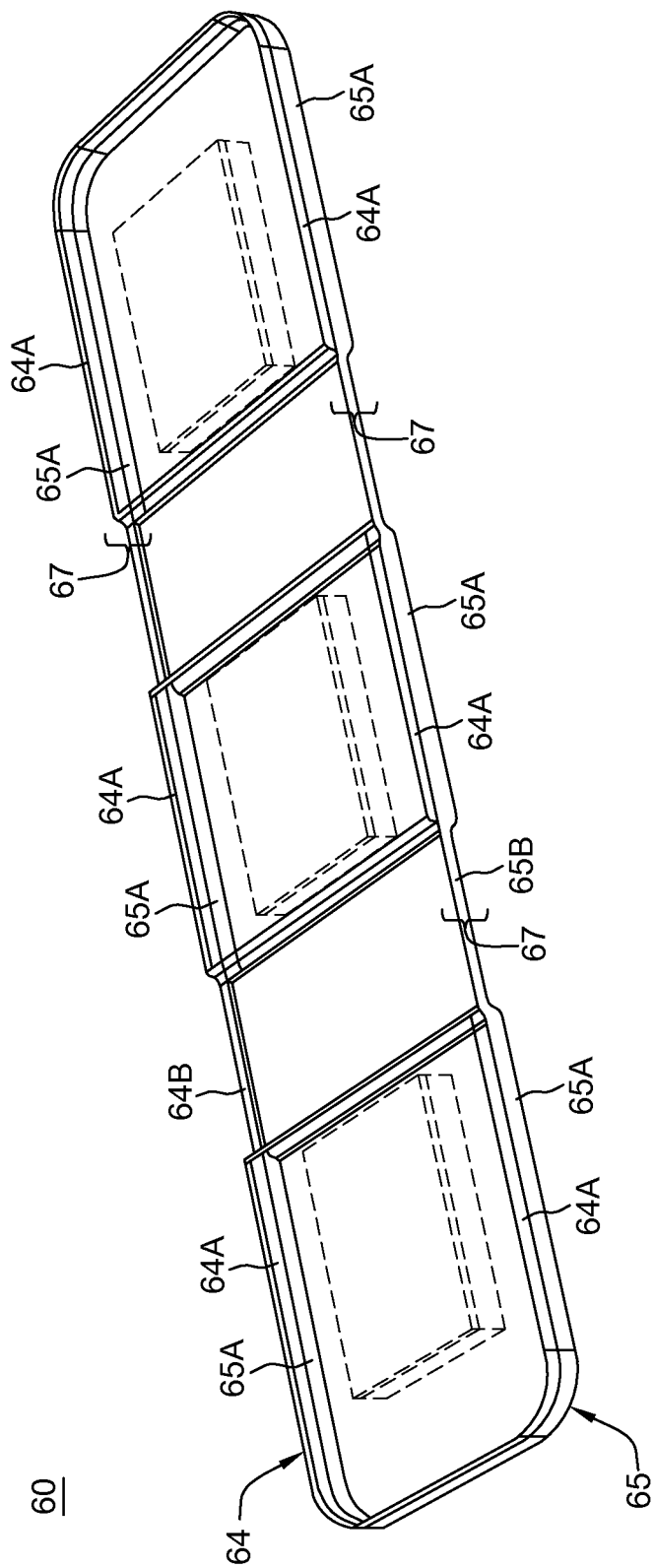
FIG. 3 shows a partially exposed, transparent perspective view of a heat sink cooling device 60 corresponds to the cooling apparatus embodiment 50 of FIG. 2A.

As stated above, this disclosure relates to flexible cold plate or heat sink design with reduced height walls between active regions where primary heat transfer occur.

As mentioned herein, reference to a top or bottom thin-walled sheet or plate member refers to a plate or sheet of metal heat sink material, e.g., copper, aluminum, zinc or stainless steel, of a thickness ranging from 0.5 mm to 1.5 mm thick, that are suitable for cooling a microelectronic component, e.g., an integrated circuit chip, or configured to cool an electronic assembly or module.

FIG. 2A shows conceptually the heat sink or cold plate design 50 (a "cooling apparatus") of enhanced flexibility that incorporates reduced height wall features that reduce stiffness of the wall structure according to a first embodiment. In the embodiment of FIG. 2A, the side wall 57 joining parallel top sheet 55 and bottom sheet 54 comprises a reduced height feature structured intermittent about the periphery to surround active regions, i.e., the wall 57 is shorter than the active area height only between active area locations 58 of the heat sink (or cold plate) corresponding to those areas that provide an interface for heat exchange between the chip 12 (or chip module), and the apparatus and correspond to locations where heat transfer elements (HTE) 56 such as fins, pins or other heat transfer structures are mounted between flexible heat sink sheets 54, 55. That is, as shown in FIG. 2A, the heat sink 50 with enhanced flexibility is shown mated with or secured in heat exchange relation with electronic components, e.g., chips 12, mounted on a carrier or substrate 51 of an electronic chip module (e.g., a multi-chip module or MCM). In this design, each chip 12 terminates in chip contact patches 13. The heat sink 50 includes a thin thermally conductive flexible heat sink sheet 54 that extends in a plane over the chips 12 and is secured to chips 12 through chip contact patches 13 utilizing a thermal interface material (TIM) (not shown). Top heat sink sheet 54 and bottom heat sink sheet 55 of enhanced flexibility define channels 53 through which a cooling fluid or heat exchange fluid flows to carry away any heat developed in the MCM.

FIG. 2B shows conceptually the flexible heat sink or cold plate design 80 that incorporates reduced height wall features that reduce stiffness of the wall structure according to a further embodiment. In the embodiment of FIG. 2B, the side wall 87 joining parallel top sheet 85 and bottom sheet 84 comprises reduced height feature everywhere with height corresponding to the active areas 88 being inset at corresponding active area locations 88 within the top and/or bottom sheets. In FIG. 2B, active areas 88 of the heat sink or cold plate cooling apparatus correspond to those areas that provide an interface for heat exchange between the chip 12 (or chip module) and the apparatus, and correspond to locations where heat transfer elements 86 such as fins, pins or other heat transfer structures are mounted to extend between flexible heat sink sheets 84, 85. As shown in FIG. 2B, the heat sink 80 with enhanced flexibility is shown mated with or secured in heat exchange relation with electronic components, e.g., chips 12, mounted on a carrier or substrate 81 of the MCM. In this design, each chip 12 terminates in chip contact patches 13. The heat sink 80 includes a thin thermally conductive flexible heat sink sheet 84 that extends in a plane over the chips 12 and is secured to chips 12 through chip contact patches 13 utilizing a thermal interface material (not shown). Flexible heat sink sheet 84 and flexible heat sink sheet 85 of enhanced flexibility, define channels 83 through which a cooling fluid or heat exchange fluid flows to carry away any heat developed in the MCM.

FIG. 3 shows an exposed perspective cross-sectional view of a heat sink cooling device 60 according to one embodiment of the present disclosure. This embodiment corresponds to the cooling apparatus embodiment 50 of FIG. 2A. In the embodiment depicted in FIG. 3, the heat sink cooling apparatus 60 includes joined, parallel formed members including a top thin-walled sheet (or plate) member 64, and a bottom thin-walled plate member 65 that form an enclosed space or chamber for air or fluid flow therein. In this embodiment of a cooling device, each top and bottom members 64, 65 include respective sidewall portions 64A, 65A of a first height and respective sidewall portions 65A, 65B of a second height where the top and bottom members 64, 65 are brazed or soldered together to form an enclosed space therebetween. The height of the sidewall portions 64A, 65A of a first height is sufficient for accommodating cooling structures 66 mounted therebetween. The second height 67 of the joined sidewall portions 64B, 65B is reduced relative to the height of sidewall portions 64B, 65B and are shown in the locations at regions between the active areas to provide enhanced flexibility.

FIG. 4A shows a perspective view of a heat sink cooling device 90 according to the second embodiment of the present disclosure. This embodiment corresponds to the cooling apparatus embodiment 80 of FIG. 2B. In the embodiment depicted in FIG. 4A, the heat sink cooling apparatus 90 includes parallel formed members including a top thin-walled sheet (or plate) member 94, and a bottom thin-walled plate member 95 that form an enclosed space or chamber for air or fluid flow therein. In this embodiment, as clearly seen in cross-sectional views of the cooling device 90 of FIGS. 4C, 4D, each top member 94 includes one or more raised parallel regions 94A while the bottom member 95 includes one or more raised parallel regions 95A corresponding to active areas. These raised portions 94A, 95A of the top and bottom members 94, 95 together define an enclosed space or chamber 93 of a first height therebetween where cooling structures are located. That is, the chamber height defined by the raised portions 94A, 95A is such that, when joined, a first height of the chamber formed therein is sufficient for accommodating a corresponding cooling structures 96 mounted therebetween as shown in the exposed view of the bottom parallel sheet portion 95 of FIG. 4B. The height of the sidewall portions 94B, 95B extending from the respective top and bottom members 94, 95 are of a height such that the joined edges of apparatus 90 are reduced in height 97 relative to the height of the parallel top and bottom sheet portions 94A, 95A for enhanced flexibility. Inlet and outlet orifice connection 98A, 98B are further provided and formed to extend external to a surface of the cooling member for connection to a media source, e.g., liquid water.

It should be understood that, in further embodiments, a raised area 94A, 95A associated with an active area (for accommodating cooling structures) may be formed on only one of the two planar elements. That is, embodiments are contemplated with only raised portions 94A on top planar member 94 with the planar bottom member 95 being flat at the corresponding active area, or alternately, embodiments are possible with only raised portions 95A formed on the bottom planar member 95 with the planar top member 94 being flat at the corresponding active area.

FIG. 4C shows a perspective view of a portion 90A of the heat sink cooling device 90 as shown in the FIG. 4A taken along a line x-x transverse to the length of the apparatus 90. In the view depicted in FIG. 4C, there is shown the parallel formed sheet members including a top thin-walled sheet (or plate) member 94, and a bottom thin-walled plate member 95 that form an enclosed space or chamber for air or fluid flow therein. FIG. 4C shows top and bottom members 94, 95 including respective raised parallel portions 94A, 95A corresponding to active areas. These raised portions are of a first distance therebetween such that when the top and bottom members 94, 95 are joined together, they form an enclosed space or chamber 93 of a first height 99 therebetween. The height of the sidewall portions 94B, 95B are such that the joined edges of apparatus 90 are of a reduced height 97 everywhere relative to the height of the chamber formed at parallel top and bottom sheet portions 94A, 95A for enhanced flexibility. As clearly seen in the perspective view of FIG. 4C, the raised parallel portions 94A, 95A within the top and/or bottom sheets that correspond to active areas are inset relative to the periphery of the apparatus with the joining wall of reduced height defining a peripheral edge.

FIG. 4D shows a perspective view of a portion 90B of the heat sink cooling device 90 as shown in the FIG. 4A taken along a line y-y along a length axis of the apparatus 90. In the view depicted in FIG. 4D, there is shown the parallel formed sheet members including a top thin-walled sheet (or plate) member 94, and a bottom thin-walled plate member 95 that form an enclosed space or chamber for air or fluid flow therein. FIG. 4D shows top and bottom members 94, 95 including respective raised parallel portions 94A, 95A corresponding to active areas. These raised portions are of a first distance therebetween such that when the top and bottom members 94, 95 are joined together, they form an enclosed space or chamber 93 of a first height 99 therebetween. The height of the sidewall portions 94B, 95B are such that the joined edges of apparatus 90 are of a reduced height 97 everywhere relative to the height of the chamber formed at parallel top and bottom sheet portions 94A, 95A for enhanced flexibility.

Figure 5:
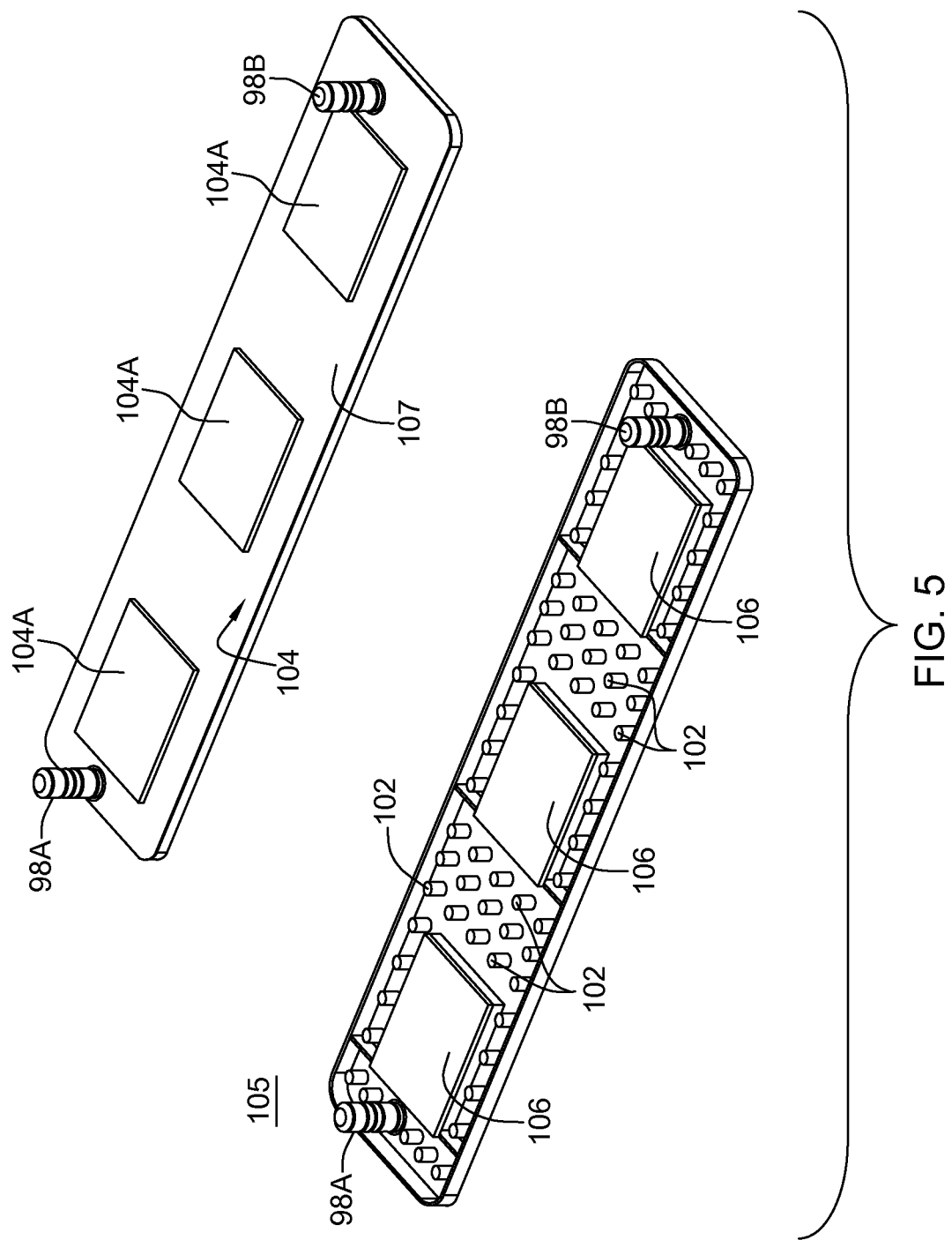
FIG. 5 shows an exploded, perspective view of a planar bottom plate member, e.g., bottom member 105 and a corresponding top member 104 according to one embodiment wherein the bottom member is showing an exposed plurality of separate post members formed in the surface and are subject to brazing or soldering to secure the top and bottom thin-walled members together in forming the apparatus.

FIG. 5 shows an exploded, perspective view of a planar bottom plate member, e.g., bottom member 105 and a corresponding top member 104 according to one embodiment wherein the bottom member 105 is showing an exposed plurality of separate post members 102 formed in the surface and are subject to brazing or soldering to secure the top and bottom thin-walled members together in forming the apparatus.

As described in commonly-owned, co-pending U.S. patent application Ser. No. 14/818,064, the whole contents and disclosure of which is incorporated by reference as if fully set forth herein, there is preferably substituted for post members a plurality of identically dimensioned stamped indent formations 102 formed in the planar surface (not including the cooling structures 96) to substitute as posts. These stamped indent formations are formed (e.g., using a metal stamp press machine) on one of the top and bottom members 104, 105 and each include respective contact surfaces that may be brazed or soldered to the top and bottom thin-walled plate members 104, 105 together to form the enclosed apparatus 90 of FIG. 4A. Use of the stamped indent portions 102 to secure planar top member 104 and parallel planar bottom member 105 advantageously reinforce the strength of the sink in order to withstand increased burst pressures as described in herein incorporated U.S. patent application Ser. No. 14/818,064.

When fixedly joined, the bottom thin-walled member 105 and the top thin-walled member 104 include planar surface 107 of reduced height relative to the raised surface portions 104A corresponding to the active areas to define the larger chamber for cooling structures 106 located therein. These raised portions 104A are shown inset from the periphery. Inlet and outlet orifice connection 98A, 98B are respectively provided that communicate with the formed interior chamber and extend external to a surface of the cooling member for connection to a media source, e.g., liquid water and liquid return.

Figure 6A:
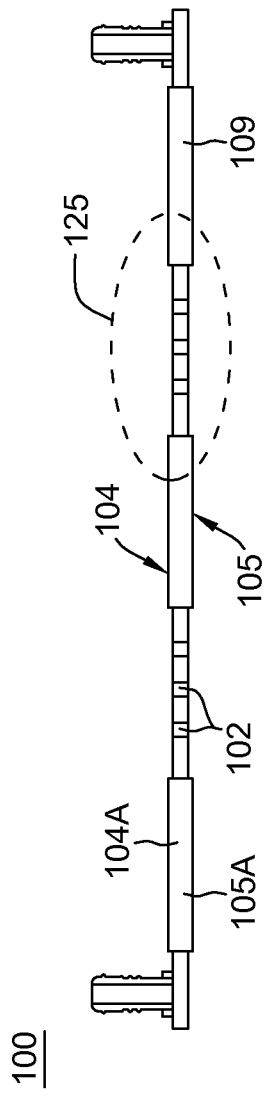
FIG. 6A shows a side cross-sectional view of a formed cooling apparatus 100 having a planar first plate member 104 and bottom plate member 105 of FIG. 5 showing thin sidewall portions 125 of reduced height everywhere excluding active area regions according to one embodiment.
Figure 6B:
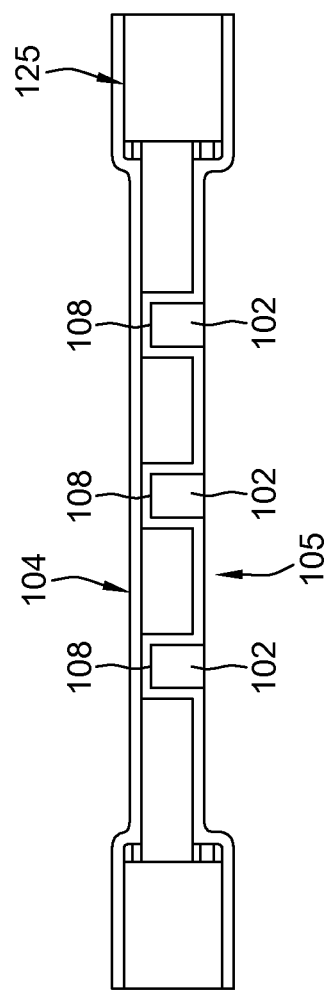
FIG. 6B depicts a zoomed-in portion 125 of the cross-sectional view of the formed cooling apparatus 100 of FIG. 6A.

FIG. 6A shows a side cross-sectional view of a cooling apparatus 100 formed with top planar member 105 and bottom planar member 104 of FIG. 5, with planar bottom plate member 105 having formed stamped indent formations 102 joined to a second planar top plate member 104 at the braze or solder locations and defining chamber regions 109 within which cooling structures (not shown) are located. FIG. 6B depicts a zoomed-in portion 125 of the cross-sectional view of the formed cooling apparatus 100 of FIG. 6A. In the portion 125 depicted, each stamped indent formation 102 of planar first plate member 105 is shown formed with a contact surface 108 that is soldered or brazed to the inside surface of the planar second plate member 104 to join the members together.

FIG. 7 shows an exploded, perspective view of a planar first plate member 104 and bottom plate member 105 of FIG. 5 according to a further embodiment wherein both the top and bottom members include plurality of post members or stamped indent formations formed in each surface and aligned such that when subject to brazing or soldering the contact surfaces of the top and bottom thin-walled members are secured together in forming the apparatus. That is, in the exploded view of FIG. 7, an exposed planar plate member 105, as described with respect to the embodiment of FIG. 5, which may be a planar bottom plate member, and a corresponding perspective view of a topside (surface) of planar plate member 104, is provided. However, in this embodiment, the corresponding planar top plate member 104 is also shown having a plurality of formed stamped indent formations 122 therein in areas of the planar surface that directly correspond to the plural formed stamped indent formations 102 formed in the parallel planar bottom member 105. The planar top plate member 104 is shown having the regions 104A corresponding to active regions, i.e., locations where cooling structures 106 are to be affixed inside the chamber. Further shown in FIG. 7 are respective inlet and outlet orifice connections 98A, 98B are provided and formed to extend external to a surface of the cooling member for connection to a media source, e.g., liquid water.

FIG. 7A depicts a zoomed-in portion 135 of a cross-sectional view of the formed cooling apparatus 100 of FIG. 7 in which the aligned contact surfaces of each top and bottom member 104, 105 are secured by brazing or soldering to form the apparatus. In the portion 135 depicted, each stamped indent formation 102 of planar (bottom) plate member 105 is shown with each contact surface of an indent soldered or brazed (affixed) at 138 to an opposing contact surface of a corresponding stamped indent formation 122 of planar second (top) plate member 104 for enhanced strength to withstand encountered burst pressures.

Thus, whether formed for application as a cold plate or heat sink, the structure and methods described herewith improve and enhance the flexibility of the heat sink or cold plate cooling apparatus.

The teachings herein may be implemented to enhance flexibility of heat sink devices such as the heat sink device described in commonly-owned U.S. Pat. No. 8,736,048. The whole contents and disclosure of U.S. Pat. No. 8,736,048 are incorporated herein by reference as if fully set forth herein. This U.S. Pat. No. 8,736,048 in particular, is directed to heat sink devices having lateral compliance features.

While the disclosure has been described in terms of specific embodiments, it is evident in view of the foregoing description that numerous alternatives, modifications and variations will be apparent to those skilled in the art. Various embodiments of the present disclosure can be employed either alone or in combination with any other embodiment, unless expressly stated otherwise or otherwise clearly incompatible among one another. Accordingly, the disclosure is intended to encompass all such alternatives, modifications and variations which fall within the scope and spirit of the disclosure and the following claims.

What is claimed is:

1. A cooling apparatus for an electronic device comprising:

a top plate member of a thermal energy conductive material, said top plate member including planar surface regions and raised surface regions;

a bottom plate member of the thermal energy conductive material, said bottom plate member including planar surface regions and raised surface regions, the raised surface regions of the top plate member in alignment with corresponding raised surface regions of the bottom plate member, wherein said bottom plate member is configured for heat exchange contact with the electronic device;

a sidewall extending between said top plate member and said bottom plate member and joining said top plate member to said bottom plate member, said top plate member, said bottom plate member and said sidewall defining a chamber, wherein a height distance of said sidewall between said top plate member and said bottom plate member at corresponding planar surface regions of said top plate member and bottom plate member other than said corresponding aligned raised surface regions of said top plate member and bottom plate member is reduced relative to a height distance of said sidewall between said top plate member and said bottom plate member at said corresponding aligned raised surface regions, wherein at least one of said top plate member and said bottom plate member includes a plurality of stamped indent formations formed at the region other than said corresponding aligned raised surface regions of said top plate member and bottom plate member, each of said stamped indent formations providing a contact surface, said top plate member being affixed to said bottom plate member at said contact surface.

2. The cooling apparatus as claimed in claim 1, further including one or more cooling structure formations affixed within said chamber at locations in alignment with said raised surface regions, said cooling formations including an array of fins or blades affixed at opposing the top plate and bottom plate members and oriented for directing a flow of a cooling media within said chamber.

3. The cooling apparatus as claimed in claim 2, wherein said sidewall extends along a periphery of said apparatus between said top plate and bottom plate members, and a height of said sidewall extending between said top plate and bottom plate members and joining said top plate member to said bottom plate member is substantially a same height as the height distance between said top plate member and said bottom plate member at the aligned raised surface regions of said top plate member and bottom plate member.

4. The cooling apparatus as claimed in claim 2, wherein said sidewall extends along a periphery of said apparatus between said top plate and bottom plate members, and a height of said sidewall extending between said top plate and bottom plate members and joining said top plate member to said bottom plate member is reduced relative to the height distance between said top plate member and said bottom plate member at said aligned raised surface regions of said top plate member and bottom plate member.

5. The cooling apparatus as claimed in claim 2, wherein said top plate member includes one or more first stamped indent formations of the plurality of stamped indent formations and said bottom plate member includes one or more second stamped indent formations of the plurality of stamped indent formations, the top plate member and the bottom plate member being oriented and aligned such that a contact surface of each of the one or more first stamped indent formations of the top plate member is affixed to a contact surface of each of the one or more second stamped indent formations of the bottom plate member by one of solder or braze material.

6. The cooling apparatus as claimed in claim 2, wherein the corresponding aligned raised surface regions of said top plate member and said bottom plate member are inset from a periphery defined by said sidewall.

7. The cooling apparatus as claimed in claim 2, wherein a surface of the raised surface region of said bottom plate member is configured for the heat exchange contact with the electronic device.

8. The cooling apparatus as claimed in claim 2, wherein the reduced height distance of said sidewall between said top plate member and said bottom plate member at the region other than said corresponding aligned raised surface regions of said top plate member and bottom plate member increases flexibility and lateral compliance of said sidewall.

9. The cooling apparatus as claimed in claim 1, wherein the top plate member and the bottom plate member are affixed at said contact surface by one of solder or braze material.

10. A cooling apparatus for an electronic device comprising:

a top plate member of a thermal energy conductive material, said top plate member including planar surface regions and raised surface regions;

a bottom plate member of the thermal energy conductive material, said bottom plate member including planar surface regions and raised surface regions, the raised surface regions of the top plate member in alignment with corresponding raised surface regions of the bottom plate member, wherein said bottom plate member is configured for heat exchange contact with the electronic device;

a sidewall extending between said top plate member and said bottom plate member and joining said top plate member to said bottom plate member, said top plate member, said bottom plate member and said sidewall defining a chamber, wherein a height distance of said sidewall between said top plate member and said bottom plate member at corresponding planar surface regions of said top plate member and bottom plate member other than said corresponding aligned raised surface regions of said top plate member and bottom plate member is reduced relative to a height distance of said sidewall between said top plate member and said bottom plate member at said corresponding aligned raised surface regions, and a separation distance between said top plate and bottom plate members and joining said top plate member to said bottom plate member is reduced relative to the height distance between said top plate member and said bottom plate member at said corresponding aligned raised surface regions, wherein at least one of said top plate member and said bottom plate member includes a plurality of stamped indent formations formed at the region other than said raised surface regions, each of said stamped indent formations providing a contact surface, said top plate member being affixed to said bottom plate member at said contact surface.

11. The cooling apparatus as claimed in claim 10, further including one or more cooling structure formations affixed within said chamber at locations in alignment with said raised surface regions, said cooling formations including an array of fins or blades affixed at opposing the top plate and bottom plate members and oriented for directing a flow of a cooling media within said chamber.

12. The cooling apparatus as claimed in claim 11, wherein the top plate member and the bottom plate member are affixed at said contact surface by one of solder or braze material.

13. The cooling apparatus as claimed in claim 11, wherein said top plate member includes one or more first stamped indent formations of the plurality of stamped indent formations and said bottom plate member includes one or more second stamped indent formations of the plurality of stamped indent formations, the top plate member and the bottom plate member being oriented and aligned such that a contact surface of each of the one or more first stamped indent formations of the top plate member is affixed to a contact surface of each of the one or more second stamped indent formations of the bottom plate member by one of solder or braze material.

14. The cooling apparatus as claimed in claim 11, wherein the raised surface regions of said top plate member and the said bottom plate member are inset from a periphery defined by said sidewall.

15. The cooling apparatus as claimed in claim 11, wherein a surface of the raised surface region of said bottom plate member is configured for the heat exchange contact with the electronic device.

16. The cooling apparatus as claimed in claim 11, wherein the reduced height distance of said sidewall between said top plate member and said bottom plate member at the region other than said raised surface regions increases flexibility and lateral compliance of said sidewall.

\* \* \* \* \*